(12) United States Patent
Hirayama (10) Patent No.: US 8,791,423 B2
(45) Date of Patent: Jul. 29, 2014

(54) ABERRATION CORRECTION DEVICE AND CHARGED PARTICLE BEAM DEVICE EMPLOYING SAME

(75) Inventor: Yoichi Hirayama, Hitachinaka (JP)

(73) Assignee: Hitachi High-Technologies Corporation, Tokyo (JP)

(*) Notice: Subject to any disclaimer, the term of this patent is extended or adjusted under 35 U.S.C. 154(b) by 0 days.

(21) Appl. No.: 13/806,057

(22) PCT Filed: Jul. 26, 2011

(86) PCT No.: PCT/JP2011/066919
§ 371 (c)(1),
(2), (4) Date: Dec. 20, 2012

(87) PCT Pub. No.: WO2012/014870
PCT Pub. Date: Feb. 2, 2012

(65) Prior Publication Data
US 2013/0112873 A1 May 9, 2013

(30) Foreign Application Priority Data

Jul. 27, 2010 (JP) ................................. 2010-168310

(51) Int. Cl.
*H01J 37/153* (2006.01)
*H01J 3/12* (2006.01)
*H01J 37/28* (2006.01)

(52) U.S. Cl.
CPC ............... *H01J 37/153* (2013.01); *H01J 37/28* (2013.01); *H01J 2237/1534* (2013.01); *H01J 2237/28* (2013.01); *H01J 2237/2802* (2013.01); *H01J 3/12* (2013.01)
USPC ........................ 250/396 R; 250/306; 250/311

(58) Field of Classification Search
CPC ............................... H01J 37/153; H01J 37/28
USPC ...................... 250/396 R, 396 ML, 397–400
See application file for complete search history.

(56) References Cited

U.S. PATENT DOCUMENTS

| 4,097,739 | A | * | 6/1978 | Muller et al. | 250/311 |
|---|---|---|---|---|---|
| 5,084,622 | A | * | 1/1992 | Rose | 250/396 R |
| 5,300,775 | A | * | 4/1994 | Van der Mast | 250/305 |
| 5,587,586 | A | * | 12/1996 | Kruit | 250/423 F |
| 6,605,810 | B1 | * | 8/2003 | Haider et al. | 250/396 R |
| 7,060,985 | B2 | * | 6/2006 | Hosokawa | 250/396 R |
| 2006/0219935 | A1 | * | 10/2006 | Henstra | 250/396 ML |
| 2007/0114408 | A1 | | 5/2007 | Honda et al. | |

(Continued)

FOREIGN PATENT DOCUMENTS

| JP | 3-295140 A | 12/1991 |
|---|---|---|
| JP | 2002-510431 A | 4/2002 |

(Continued)

OTHER PUBLICATIONS

International Search Report dated Sep. 6, 2011 (two (2) pages).

*Primary Examiner* — Michael Logie
*Assistant Examiner* — Kevin Chung
(74) *Attorney, Agent, or Firm* — Crowell & Moring LLP (57) ABSTRACT

An aberration correction device includes, between a TEM objective lens and an STEM objective lens, a transfer lens group for transferring a coma-free surface of the TEM objective lens to a multipolar lens, a transfer lens group for transferring the coma-free surface of the TEM objective lens to a multipolar lens, and a transfer lens for correcting fifth-order spherical aberration of the STEM objective lens.

6 Claims, 4 Drawing Sheets

(56) References Cited

U.S. PATENT DOCUMENTS

| | | |
|---|---|---|
| 2007/0125945 A1 | 6/2007 | Van der Zande et al. |
| 2007/0215009 A1* | 9/2007 | Shimazu et al. ............... 106/600 |
| 2009/0014648 A1* | 1/2009 | Zeile et al. .................... 250/306 |
| 2009/0032709 A1* | 2/2009 | Sawada ......................... 250/311 |
| 2009/0039281 A1* | 2/2009 | Kawasaki et al. ......... 250/396 R |
| 2009/0230317 A1 | 9/2009 | Hirayama et al. |
| 2009/0242786 A1 | 10/2009 | Yoshida et al. |

FOREIGN PATENT DOCUMENTS

| | | |
|---|---|---|
| JP | 2007-128656 A | 5/2007 |
| JP | 2007-157719 A | 6/2007 |
| JP | 2009-224067 A | 10/2009 |
| JP | 2009-245841 A | 10/2009 |

* cited by examiner

FIG. 1

PRIOR ART

FIG. 2

PRIOR ART

ABERRATION CORRECTION DEVICE AND CHARGED PARTICLE BEAM DEVICE EMPLOYING SAME

TECHNICAL FIELD

The present invention relates to an aberration correction device for correcting the spherical aberration of an objective lens serving as a rotationally symmetric lens, and a charged particle beam device employing the same.

BACKGROUND ART

Electron microscopes such as scanning electron microscopes (SEMS), transmission electron microscopes (TEMs), and scanning transmission electron microscopes (STEMs) require electron lenses which use an electric field or magnetic field to concentrate an electron beam. Lenses acting as spherical lenses that use a rotationally symmetric electromagnetic field are used as electron lenses most widely. Such rotationally symmetric electron lenses are known to inevitably suffer a positive spherical aberration. Even a combination of rotationally symmetric electron lenses cannot make a negative spherical aberration. Accordingly, it is not possible to achieve spherical aberration correction which is achieved by a combination of concave and convex lenses in optics. In traditional electron microscopes, the spherical aberration acts as a main factor that substantially determines the resolution.

On the other hand, it is pointed out that the spherical aberration of an electron lens can be corrected in principle by combing non-rotationally symmetric multipole lenses. However, such a multipole corrector has a complicated structure, since it uses a quadrupole, hexapole, octupole, and the like in multiple stages.

Aberration correction devices include one that generates a hexapole field using a multipole lens to correct the spherical aberration of a rotationally symmetric lens. This aberration correction device performs spherical aberration correction on the following principles. The aberration correction device typically generates a hexapole field using a multiple lens with respect to the positive spherical aberration of an objective lens. Thus, it generates a negative spherical aberration, compensating the spherical aberration of the objective lens. Further, changing the strength of the hexapole field allows the negative spherical aberration to be controlled. Thus, it is possible to control, to any amount, the spherical aberration of the lenses included in the electron microscope, that is, the spherical aberration of the entire optical system, including objective lenses, illumination lenses, and projection lenses. However, the hexapole field generates a second-order aberration. In this case, by disposing two transfer lenses serving as rotationally symmetric lenses between the two multipole lenses and reversing the trajectory of an electron beam between the multipole lenses, the second-order aberration of the hexapole field can be compensated.

Figure 1:
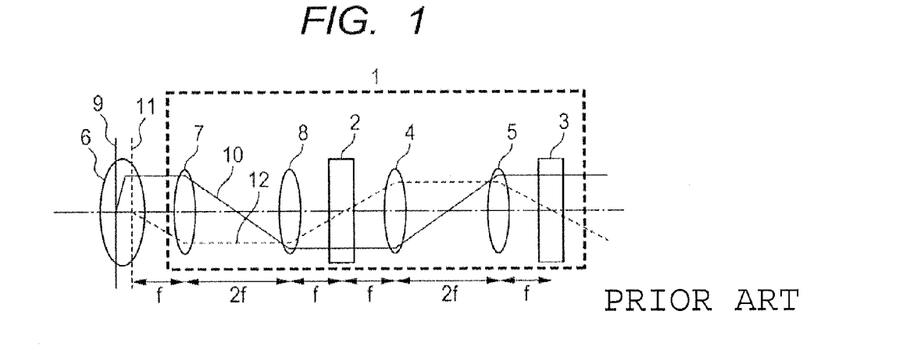
FIG. 1 is a schematic diagram showing the lens layout of a traditional aberration correction device which uses multipole lenses and transfer lenses as rotationally symmetric lenses, and the trajectory of an electron beam.

Patent Literature 1 discloses an example of a device for correcting the spherical aberration of rotationally symmetric lenses of an electron microscope as described above. FIG. 1 is a schematic diagram thereof. While lenses are illustrated In FIG. 1 as if they were optical lenses, such an illustration is intended for simplification. Actually, these lenses are electron lenses which use a magnetic field.

In an aberration correction device 1, transfer lenses 4 and 5 serving as rotationally symmetric lenses are disposed between multipole lenses 2 and 3, and two transfer lenses serving as rotationally symmetric lenses, 7 and 8, are disposed between the multipole lens 2 and an objective lens 6. The respective focal lengths of the transfer lenses serving as rotationally symmetric lenses are both the same and represented by f; the distance between the transfer lenses 7 and 8 serving as rotationally symmetric lenses by 2f; the respective distances between the multipole lens 2 and the transfer lenses 4 and 8 serving as rotationally symmetric lenses both by f; the distance between the transfer lenses 4 and 5 serving as rotationally symmetric lenses by 2f; and the distance between the multipole lens 3 and the transfer lens 5 serving as a rotationally symmetric lens by f. Traditionally, in making a high-resolution observation using an electron microscope, a specimen position 9 is present in the objective lens 6 serving as a rotationally symmetric lens, and the objective lens 6 serving as a rotationally symmetric lens is used under very strong excitation so that the focal length thereof becomes several mm. An on-axis trajectory 10 is the trajectory of an electron beams passing through the intersection of the specimen and the optical axis and having a certain angle with respect to the optical axis. The on-axis trajectory 10 enters the multipole lens 2 in parallel with the optical axis. Subsequently, the trajectory is reversed by the transfer lenses 4 and 5 serving as rotationally symmetric lenses and enters the multipole lens 3 in parallel with the optical axis as well (spherical aberration correction condition). This spherical aberration correction condition can be met by disposing the multipole lenses 2 and 3 and the transfer lenses 4 and 5 serving as rotationally symmetric lenses as described above. Further, exciting the multipole lenses 2 and 3 to the same degree allows the second-order aberration to be compensated. Specifically, a spherical aberration having a sign opposite to that of the spherical aberration of the objective lens 6 as a rotationally symmetric lens and having an amount corresponding to half the amount of the spherical aberration of the objective lens 6 is provided to the respective hexapole fields of the two multipole lenses, 2 and 3. Thus, it is possible to correct the spherical aberration of the objective lens serving as a rotationally symmetric lens while compensating the second-order aberration.

Further, the aberration correction device in FIG. 1 is configured to correct an on-axis coma aberration. A rotationally symmetric lens has a plane which does not generate an on-axis coma aberration. This plane is called a coma-free plane. Generally, a coma-free plane is located adjacent to the back focal plane of a rotationally symmetric lens. Accordingly, when a high-resolution observation is made by disposing a specimen position 9 in the objective lens 6 serving as a rotationally symmetric lens and using the objective lens serving as a rotationally symmetric lens under strong excitation, a coma-free plane 11 of the objective lens 6 serving as a rotationally symmetric lens is located several mm behind the objective lens 6 serving as a rotationally symmetric lens. Since the distance between the coma-free plane 11 of the objective lens 6 as a rotationally symmetric lens and the transfer lens 7 serving as a rotationally symmetric lens is set to f, the coma-free plane 11 can be transferred to the coma-free plane of the transfer lens 7 serving as a rotationally symmetric lens.

According to the configuration of FIG. 1, the coma-free plane 11 can be transferred to the respective coma-free planes of the transfer lenses 8, 4, and 5 serving as rotationally symmetric lenses on similar principles. If a trajectory passing through the centers of the two multipole lenses, 2 and 3, becomes symmetrical with respect to the midpoint between the multipole lenses 2 and 3, the coma aberration of the multipole lenses can be compensated (coma-free plane transfer condition). In FIG. 1, an off-axis trajectory 12 passing through the coma-free plane 11 of the objective lens 6 passes through the centers of the multipole lenses 2 and 3 and becomes symmetrical with respect to the midpoint between the two multipole lenses, 2 and 3. Thus, the coma-free plane is transferred, correcting the on-axis coma aberration.

As seen, in the aberration correction device having the configuration of FIG. 1, the spherical aberration correction condition is met by the on-axis trajectory 10 between the multipole lenses 2 and 3 forming a rear part of the aberration correction device 1, and the coma-free plane transfer condition is met by the off-axis trajectory 12 between the objective lens 6 and the multipole lens 2 forming a front part of the aberration correction device 1.

Figure 2:
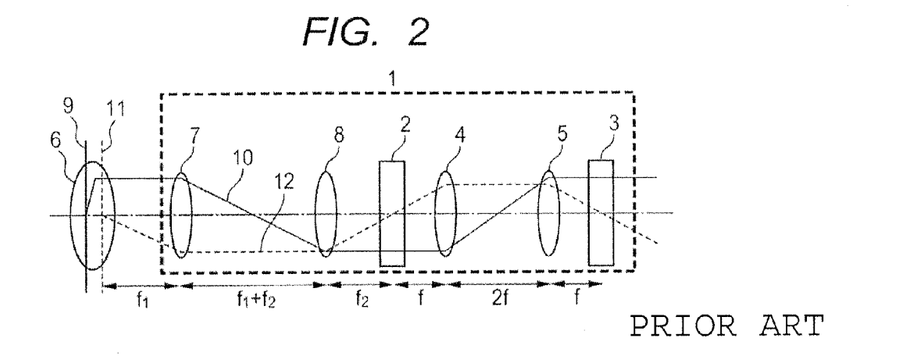
FIG. 2 is a schematic diagram showing the lens layout of another traditional aberration correction device which uses multipole lenses and transfer lenses as rotationally symmetric lenses, and the trajectory of an electron beam.

Patent Literature 2 discloses the correction of a spherical aberration according to another configuration. FIG. 2 is a schematic diagram thereof. While the configuration between the multipole lenses 2 and 3 forming a rear part of the aberration correction device 1 is the same as that in FIG. 1, the configuration between the objective lens 6 as a rotationally symmetric lens and the multipole lens 2 forming a front part of the aberration correction device 1 differs from that in FIG. 1.

In FIG. 2, the focal lengths of the transfer lenses 7 and 8 serving as rotationally symmetric lenses are represented by $f_1$, $f_2$, respectively; the distance between the coma-free plane 11 of the objective lens 6 as a rotationally symmetric lens and the transfer lens 7 serving as a rotationally symmetric lens by f1; the distance between the transfer lenses 7 and 8 serving as rotationally symmetric lenses by $f_1+f_2$; and the distance between the transfer lens 8 serving as a rotationally symmetric lens and the multipole lens 2 by $f_2$. Since the rear part of the aberration correction device 1 has the same configuration as in FIG. 1, the on-axis trajectory 10 meets the spherical aberration correction condition on the same principles. Although the front part of the aberration correction device 1 differs from that in FIG. 1 in configuration, the off-axis trajectory 12 meets the coma-free plane transfer condition, since the transfer lenses 7 and 8 serving as rotationally symmetric lenses are disposed in the positions of the focal lengths.

Features of the aberration correction device in FIG. 2 include ease of fine-adjustment of the spherical aberration. When changing the focal length of the objective lens 6 as a rotationally symmetric lens for focusing or other purposes, the spherical aberration of the objective lens 6 as a rotationally symmetric lens, and the coma-free plane 11 are slightly changed. Accordingly, in the configuration of FIG. 1, the focal lengths f of all the rotationally symmetric lenses must be adjusted. On the other hand, in the fine-adjustment of the spherical aberration correction of the objective lens 6 as a rotationally symmetric lens in the configuration of FIG. 2, the position of the on-axis trajectory 10 passing through the multipole lens 2 is not changed even when fine-adjusting the focal lengths $f_1$, $f_2$ of the transfer lenses 7 and 8 serving as rotationally symmetric lenses. Accordingly, it is possible to correct the spherical aberration without having to change the focal lengths f of the transfer lenses 4 and 5 serving as rotationally symmetric lenses or changing the excitation of the multipole lenses 2 and 3. As a result, according to the configuration of FIG. 2, the following effects can be expected: the spherical aberration correction condition and the coma-free plane transfer condition can be met by fine-adjusting the positions and focal lengths $f_1$, $f_2$ of the transfer lenses 7 and 8 serving as rotationally symmetric lenses, which makes it easy to fine-adjust spherical aberration correction.

FIGS. 1 and 2 show optical systems in TEM observation. An electron beam enters the optical system from the objective lens 6 and exits it from the multipole lens 3 toward a projection lens. The incoming direction of an electron beam in STEM observation is considered to be opposite to that in TEM observation. An electron beam enters the optical system from the multipole lens 3 and exits it from the objective lens 6 toward a projection lens. Since the spherical aberration correction condition and the coma-free plane transfer condition are the same as those in TEM observation, the on-axis trajectory 10 and the off-axis trajectory 12 are the same as those in FIGS. 1 and 2.

CITATION LIST

Patent Literature

Patent Literature 1: Japanese Unexamined Patent Application Publication No. 3-295140
Patent Literature 2: Japanese Unexamined Patent Application Publication (Translation of PCT Application) No. 2002-510431

SUMMARY OF INVENTION

Technical Problem

As described above, in a traditional spherical aberration correction device, an objective lens and an aberration correction device must be disposed in this order in the incoming direction of an electron beam for TEM observation; an aberration correction device and the objective lens must be disposed in this order in the incoming direction of an electron beam for STEM observation. That is, in a TEM/STEM device, an aberration correction device for STEM, an objective lens, and an aberration correction device for TEM must be disposed in this order in the incoming direction of an electron beam.

However, as shown in the above-mentioned FIGS. 1 and 2, the aberration correction device for TEM and the aberration correction device for STEM have quite the same configuration. By disposing the single objective lens for TEM/STEM between the two aberration correction devices having the same configuration but different orientations, aberration correction is performed for each of TEM and STEM.

Further, as shown in FIGS. 1 and 2, the aberration correction device uses two multipole lenses and four transfer lenses serving as rotationally symmetric lenses. Accordingly, the control of these lenses is complicated. Performing aberration correction for each of TEM and STEM requires doubling the number of lenses to be controlled and increasing the number of lens power supplies. Although the respective aberration correction devices for TEM and STEM are independently controlled, the control is complicated.

In view of the foregoing, the present invention has been made. Accordingly, an object of the invention is to provide an aberration correction device capable of being used for both TEM and STEM and a charged particle beam device employing the same.

Solution to Problem

To realize an aberration correction device capable of being used for both TEM and STEM, two objective lenses as rotationally symmetric lens are disposed and separately used for TEM and STEM rather than separately disposing respective aberration correction devices for TEM and STEM. Specifically, an objective lens for TEM, an aberration correction device, and an objective lens for STEM are disposed in this order in the incoming direction of an electron beam. The configuration of this aberration correction device capable of being used for both TEM and STEM is the same as that of a traditional aberration correction device in that two transfer lenses serving as rotationally symmetric lenses are disposed between two multipole lenses; and two transfer lenses serving as rotationally symmetric lenses are disposed between an objective lens for TEM and a multipole lens. However, this aberration correction device has a single transfer lens serving as a rotationally symmetric lens between a multipole lens and an objective lens for STEM.

While a traditional aberration correction device has two transfer lenses serving as rotationally symmetric lenses between a multipole lens and an objective lens for STEM, this aberration correction device has a single transfer lens therebetween. A transfer lens serving as a rotationally symmetric lens disposed between a multipole lens and an objective lens serving as a rotationally symmetric lens is intended to transfer a coma-free plane. However, only an on-axis trajectory is considered in STEM observation. Accordingly, there is no need to transfer a coma-free plane considering an off-axis trajectory. The single transfer lens serving as a rotationally symmetric lens is disposed as a fifth-order spherical aberration correction condition.

In TEM observation, lenses from an objective lens for TEM to a multipole lens adjacent to an objective lens for STEM are used as an aberration correction device for TEM to correct the aberration. At this time, a single transfer lens serving as a rotationally symmetric lens between the multipole lens and the objective lens for STEM is used as a projection lens, and the objective lens for STEM is not used or used as a projection lens.

In STEM observation, lenses from the objective lens for STEM to a multipole lens adjacent to an objective lens for TEM are used as an aberration correction device for STEM to correct the aberration. At this time, two transfer lenses as rotationally symmetric lenses between the multipole lens and the objective lens for TEM are used as illumination lenses, and the objective lens for TEM is not used or used as an illumination lens.

Specifically, this aberration correction device is an aberration correction device disposed between two objective lenses, an objective lens for TEM and an objective lens for STEM, and configured to correct the aberration of the objective lens for TEM or objective lens for STEM. The aberration correction device includes: a first multipole lens disposed adjacent to the objective lens for TEM; a second multipole lens disposed adjacent to the objective lens for STEM; a plurality of first transfer lenses disposed between the first and second multipole lenses and configured to transfer a coma-free plane of the objective lens for TEM to the second multipole lens; a plurality of second transfer lenses disposed between the first multipole lens and the objective lens for TEM and configured to transfer the coma-free plane of the objective lens for TEM to the first multipole lens; and a third transfer lens disposed between the second multipole lens and the objective lens for STEM and configured to correct a fifth-order spherical aberration. In TEM observation, the second transfer lenses, the first multipole lens, the first transfer lenses, and the second multipole lens are used to correct the aberration of the objective lens for TEM; in STEM observation, the first multipole lens, the first transfer lenses, the second multipole lens, and the third transfer lens are used to correct the aberration of the objective lens for STEM. Thus, aberration correction can be performed for each of TEM and STEM.

In TEM observation, a specimen is disposed on a specimen stage for TEM adjacent to the objective lens for TEM and observed with the objective lens for TEM under strong excitation. The third transfer lens, which is not used for aberration correction, is used as a projection lens. The objective lens for STEM is not used or used as a projection lens under weak excitation.

In STEM observation, a specimen is disposed on a specimen stage for STEM adjacent to the objective lens for STEM and observed with the objective lens for STEM under strong excitation. The second transfer lenses, which are not used for aberration correction, are used as an illumination-lens system. The objective lens for TEM is not used or used as an illumination lens under weak excitation. There is also provided a charged particle beam device including an aberration correction device having the above-mentioned configuration. Other features of the present invention will be clarified using embodiments of the present invention and the accompanying drawings.

Advantageous Effects of Invention

Traditionally, aberrations are corrected by using two aberration correction devices, one for TEM and another for STEM. According to the present invention, on the other hand, the aberration correction device capable of being used for both TEM and STEM is disposed between the objective lens for TEM and the objective lens for STEM. As a result, aberration correction can be performed for each of TEM and STEM using the single aberration correction device. Since the number of aberration correction devices can be reduced by one while increasing the number of objective lenses by one, the complexity of the control as well as cost can be reduced.

DESCRIPTION OF EMBODIMENTS

First Embodiment

Now, a first embodiment according to the present invention will be described with reference to the accompanying drawings. However, it should be noted that this embodiment is only an example for carrying out the present invention and does not limit the technical scope of the invention. Components common to the drawings are given the same reference numerals.

Figure 3:
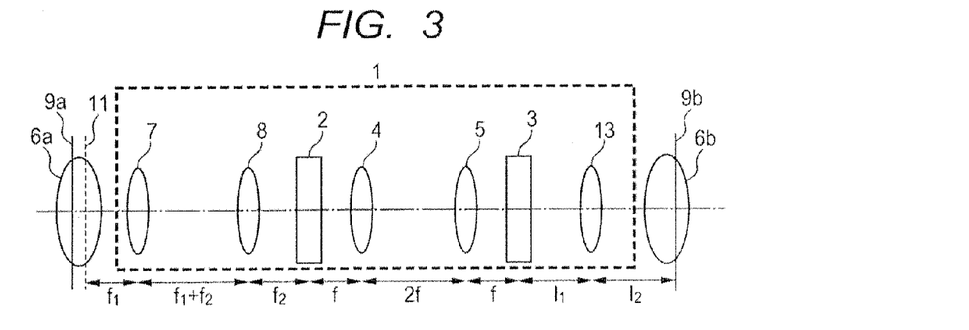
FIG. 3 is a schematic diagram showing the entire lens layout of an aberration correction device according to a first embodiment.

FIG. 3 shows a schematic configuration of an aberration correction device according to this embodiment. As shown in FIG. 3, in an aberration correction device 1, transfer lenses 4 and 5 serving as rotationally symmetric lenses are disposed between multipole lenses 2 and 3; transfer lenses 7 and 8 serving as rotationally symmetric lenses are disposed between an objective lens 6a for TEM serving as a rotationally symmetric lens and the multipole lens 2; and a transfer lens 13 serving as a rotationally symmetric lens is disposed between an objective lens 6b for STEM serving as a rotationally symmetric lens and a multipole lens 3. The focal lengths of the transfer lenses 4 and 5 serving as rotationally symmetric lenses are both represented by f; the distance between the multipole lens 2 and the transfer lens 4 serving as a rotationally symmetric lens and the distance between the multipole lens 3 and the transfer lens 5 serving as a rotationally symmetric lens both by f; and the distance between the transfer lenses 4 and 5 serving as rotationally symmetric lenses by 2f. The focal lengths of transfer lenses 7 and 8 serving as rotationally symmetric lenses are represented by $f_1$, $f_2$, respectively; the distance between a coma-free plane 11 of the objective lens 6a for TEM and the transfer lens 7 serving as a rotationally symmetric lens by $f_1$; the distance between the transfer lenses 7 and 8 serving as rotationally symmetric lenses by $f_1+f_2$; and the distance between the transfer lens 8 serving as a rotationally symmetric lens and the multipole lens 2 by $f_2$. The distance between the multipole lens 3 and the transfer lens 13 serving as a rotationally symmetric lens and the distance between the transfer lens 13 serving as a rotationally symmetric lens and the objective lens 6b for STEM are represented by $l_1$, $l_2$, respectively. An aperture device for controlling the spreading angle of a beam, a polarizer for adjusting the trajectory of a beam, and the like, which are not important in describing the present invention, are omitted FIGS. 3 to 5.

Figure 4:
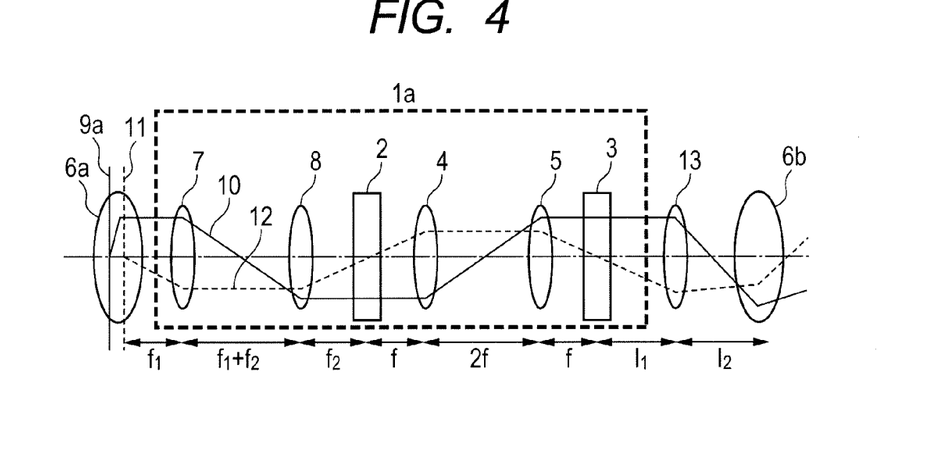
FIG. 4 is a schematic diagram showing a lens layout and the trajectory of an electron beam in making TEM observation using the aberration correction device according to the first embodiment.

FIG. 4 shows a configuration for achieving aberration correction using the aberration correction device according to this embodiment in TEM observation. A specimen is disposed on a specimen stage 9a for TEM; the objective lens 6a for TEM is used under strong excitation (so that the focal length thereof becomes several mm); and the aberration is corrected by an aberration correction device 1a. The transfer lens 13 serving as a rotationally symmetric lens is used as a projection lens; and the objective lens 6a for TEM is not used or used as a projection lens under weak excitation (so that the focal length thereof becomes several tens of mm or greater).

As shown in FIG. 4, an on-axis trajectory 10 emitted from the intersection of the specimen disposed on the specimen stage 9a for TEM and the optical axis and having a certain angle with respect to an optical axis enters the multipole lenses 2 and 3 in parallel with the optical axis. The beam trajectory is reversed by the transfer lenses 4 and 5 serving as rotationally symmetric lenses. If the beam enters the multipole lenses 2 and 3 in this manner, the above-mentioned spherical aberration correction condition can be met. An off-axis trajectory 12 passing through the coma-free plane 11 of the objective lens 6a for TEM is a trajectory which is projected on the centers of the multipole lenses 2 and 3. If such a beam trajectory is obtained, the coma-free plane transfer condition can be met.

Figure 5:
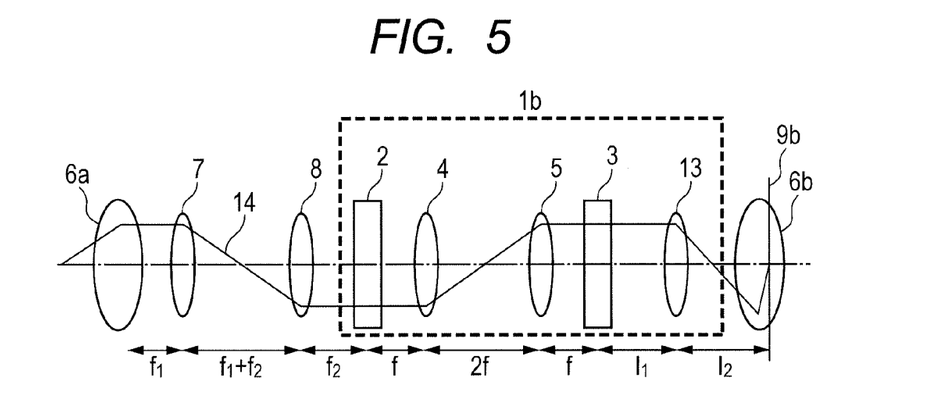
FIG. 5 is a schematic diagram showing a lens layout and the trajectory of an electron beam in making STEM observation using the aberration correction device according to the first embodiment.

FIG. 5 shows a configuration for achieving aberration correction using the aberration correction device according to this embodiment in STEM observation. A specimen is disposed on a specimen stage 9b for STEM; the objective lens 6b for STEM is used under strong excitation (so that the focal length thereof becomes several mm); and the aberration is corrected by an aberration correction device 1b. The transfer lenses 7 and 8 serving as rotationally symmetric lenses are used as a illumination-lens system; and the objective lens 6a for TEM is not used or used as an illumination lens under weak excitation (so that the focal length thereof becomes several tens of mm or greater).

In STEM observation, a beam is concentrated on the specimen to form a beam spot; a certain region of the beam spot is scanned; and electrons that have passed through the specimen are detected to form an image. That is, the resolution in STEM observation depends on the size of the beam spot on the specimen, and the size of the beam spot is limited by the aberration (typically, the spherical aberration of the objective lens). While the spherical aberration of the objective lens is corrected by the aberration correction device in both TEM and STEM, only a trajectory contributing to the beam spot, that is, an on-axis trajectory 14 in FIG. 5 is considered in STEM. Accordingly, there is no need to consider a trajectory corresponding to the off-axis trajectory 12 in FIG. 4 The on-axis trajectory 14 is a trajectory emitted from the intersection of the specimen disposed on the specimen stage 9b for STEM and the optical axis and having a certain angle with respect to the optical axis. The on-axis trajectory 14 meets the spherical aberration correction condition for the same reason as the on-axis trajectory 10 does in TEM observation (FIG. 4).

The transfer lens 13 serving as a rotationally symmetric lens in FIG. 5 corresponds to the transfer lenses 4 and 5 serving as rotationally symmetric lenses in FIG. 4. Specifically, in TEM observation of FIG. 4, the rotationally symmetric lenses 4 and 5 are used to transfer the coma-free plane; in STEM observation of FIG. 5, there is no need to consider an off-axis trajectory for transferring the coma-free plane, as described above. Accordingly, the transfer lens 13 serving as a rotationally symmetric lens is used as another condition, a fifth-order spherical aberration correction condition. The reason is as follows.

Changing the focal length of the transfer lens 13 serving as a rotationally symmetric lens causes a change in the magnification of the objective lens 6b for STEM. This results in a change in the spherical aberration coefficient on the object plane of the objective lens 6b for STEM. The spherical aberration coefficient on the object plane refers to a spherical aberration coefficient obtained by considering the magnification. Among others, an objective lens is used under strong excitation and thus has a large magnification, as well as a large spherical aberration coefficient on the object plane thereof. In contrast, an illumination lens or projection lens is used under weak excitation and thus has a small magnification, as well as a small spherical aberration coefficient on the object plane thereof. For this reason, the spherical aberration of an objective lens acts as a main factor that limits the resolution of the electronic microscope. Accordingly, changing the focal length (excitation) of the transfer lens 13 serving as a rotationally symmetric lens allows the spherical aberration to be controlled. Since the spherical aberration can be controlled by changing the excitation of the multipole lenses 2 and 3, the spherical aberration controlled by changing the excitation of the transfer lens 13 serving as a rotationally symmetric lens is preferably the fifth-order spherical aberration. Typically, the spherical aberration of an objective lens refers to the third-order spherical aberration. The negative spherical aberration controlled by the multipole lenses 2 and 3 is also the third-order spherical aberration. What limits the resolution in the correction of the third-order spherical aberration is chromatic aberration or the fifth-order aberration.

While chromatic aberration cannot be controlled by the aberration correction device according to this embodiment, the fifth-order spherical aberration out of the fifth-order aberrations can be controlled by changing the excitation of the transfer lens 13 serving as a rotationally symmetric lens. The fifth-order spherical aberration correction condition is determined by the excitation and position of the transfer lens 13 serving as a rotationally symmetric lens. If the focal length of the transfer lens 13 serving as a rotationally symmetric lens is represented by $f_3$; the distance between the multipole lens 3 and the transfer lens 13 serving as a rotationally symmetric lens by $l_1$; and the distance between the transfer lens 13 serving as a rotationally symmetric lens and the objective lens 6b for STEM by $l_2$, the fifth-order spherical aberration correction condition needs to meet the following formula.

[Formula 1]

$$f_3 = \frac{(4T + 7l_1)l_2}{4T + 7(l_1 + l_2)} \quad (1)$$

In Formula (1), T represents the thickness of a pole of a multipole lens in the optical axis direction. As seen, the fifth-order spherical aberration correction condition is limited by the focal length of the transfer lens 13 serving as a rotationally symmetric lens. Accordingly, the position of the transfer lens 13 serving as a rotationally symmetric lens can be selected freely to some extent. However, the position of the transfer lens 13 serving as a rotationally symmetric lens limits the fifth-order astigmatic aberration. The fifth-order astigmatic aberration is one of the fifth-order aberrations and acts as a factor that limits the resolution when the fifth-order spherical aberration and the third- and lower-order aberrations are corrected. The fifth-order astigmatic aberration cannot be corrected by the aberration correction device according to this embodiment, and the magnitude thereof is determined by the configuration of the aberration correction device. A fifth-order astigmatic aberration coefficient A5 is obtained by the following formula.

[Formula 2]

$$A_S = \frac{9T(l_2 - f_3 + f_{OBJ})^8 C_S^2}{56(l_2 - f_3)^6 f_{OBJ}^2 f_3^2} \quad (2)$$

In Formula (2), $f_{OBJ}$ and $C_s$ are the focal length of an objective lens serving as a rotationally symmetric lens and the spherical aberration coefficient of the objective lens, respectively. As seen, the fifth-order astigmatic aberration coefficient A5 is limited by a focal length $f_3$ of the transfer lens 13 serving as a rotationally symmetric lens. Specifically, substitution of Formula (1) into Formula (2) reveals that the fifth-order astigmatic aberration coefficient depends on the distance $l_1$ between the multipole lens 3 and the transfer lens 13 serving as a rotationally symmetric lens and the distance $l_2$ between the transfer lens 13 serving as a rotationally symmetric lens and the objective lens 6b for STEM. Accordingly, the position of the transfer lens 13 serving as a rotationally symmetric lens needs to be determined so that the fifth-order astigmatic aberration coefficient is reduced. Reducing the fifth-order astigmatic aberration coefficient only requires increasing the distance between the multipole lens 3 and the transfer lens 13 serving as a rotationally symmetric lens and reducing the distance $l_2$ between the transfer lens 13 serving as a rotationally symmetric lens and the objective lens 6b for STEM. However, increasing the distance $l_1$ between the multipole lens 3 and the transfer lens 13 serving as a rotationally symmetric lens results in an increase in the total length of the aberration correction device, causing structural instability. Further, there is a limit to reducing the distance $l_2$ between the transfer lens 13 serving as a rotationally symmetric lens and the objective lens 6b for STEM, since the distance $l_2$ is mechanically limited. In view of the foregoing, the configuration of the aberration correction device needs to be determined.

In switching from TEM to STEM and using STEM and vice versa, there is no need to change the excitation of the transfer lenses 4, 5, 7, 8, and 13 serving as rotationally symmetric lenses in the aberration correction device 1. This is because the on-axis trajectory 10 in TEM observation in FIG. 4 and the on-axis trajectory 14 in STEM observation in FIG. 5 become the same trajectory in the aberration correction device, that is, become the same trajectory between the transfer lenses 7 and 13 serving as rotationally symmetric lenses.

More specifically, the spherical aberration correction condition is the same for both TEM and STEM and is that the on-axis trajectory 10 or on-axis trajectory 14 emitted from the intersection of the specimen and the optical axis and having a certain angle with respect to the optical axis enters the multipole lenses 2 and 3 in parallel with the optical axis; and the beam trajectory is reversed by the transfer lenses 4 and 5 serving as rotationally symmetric lenses. As seen in FIGS. 4 and 5, both the on-axis trajectories 10 and 14 meet the spherical aberration correction condition.

The coma-free plane transfer condition is important in TEM observation and is controlled by changing the excitation of the transfer lenses 7 and 8 serving as rotationally symmetric lenses. As seen in FIG. 4, the transfer lens 13 serving as a rotationally symmetric lens is not a component of the aberration correction device 1a for TEM and therefore is used as a projection lens. There is no limit to the lens condition thereof, and the lens condition may be one that meets the fifth-order spherical aberration correction condition.

The fifth-order spherical aberration correction condition is important in STEM observation and is controlled by changing the excitation of the transfer lens 13 serving as a rotationally symmetric lens. As seen in FIG. 5, the transfer lenses 7 and 8 serving as rotationally symmetric lenses are not components of the aberration correction device 1b and therefore are used as an illumination-lens system. To meet the spherical aberration correction condition, the transfer lenses 7 and 8 serving as rotationally symmetric lenses need to be adjusted so that the on-axis trajectory 14 enters the multipole lens 2 in parallel with the optical axis. The lens condition may be that which meets the coma-free plane transfer condition in TEM observation.

As seen above, in switching from TEM to STEM and using STEM and vice versa, there is no need to change the excitation of the transfer lenses 4, 5, 7, 8, and 13 serving as rotationally symmetric lenses in the aberration correction device 1. Further, while the spherical aberration is controlled by changing the excitation of the multipole lenses 2 and 3, there is no need to change the excitation of the multipole lenses 2 and 3 in switching from TEM to STEM and using STEM and vice versa. This is because if the spherical aberration of the objective lens 6a for TEM used under strong excitation (in TEM observation) and the spherical aberration of the objective lens 6b for STEM used under strong excitation as well (in STEM observation) are the same in amount, the respective negative spherical aberrations given by the multipole lenses 2 and 3 become the same in amount. Accordingly, in switching from TEM to STEM and using STEM and vice versa, there is no need to change the excitation of the components of the aberration correction device 1 (the multipole lenses 2 and 3 and the transfer lenses 4, 5, 7, 8, and 13 serving as rotationally symmetric lenses). As a result, the control of the aberration correction device 1 can be simplified by using the objective lens 6a for TEM under strong excitation and the objective lens 6b for STEM under weak excitation in TEM observation and using the objective lens 6b for STEM under strong excitation and the objective lens 6a for TEM under weak excitation in STEM observation.

If the objective lens 6a for TEM and the objective lens 6b for STEM have different spherical aberration amounts, the negative spherical aberration is typically controlled and corrected by changing the excitation of the multipole lenses 2 and 3. However, it is very difficult to control the multipole lenses and therefore the spherical aberration may be controlled using another method. As six-pole fields generated by the multipole lenses spread farther from the optical axis, they become more influential. Accordingly, the spherical aberration can be controlled by controlling the distance between the on-axis trajectory and the optical axis while maintaining the spherical aberration correction condition that the on-axis trajectory 10 or on-axis trajectory 14 enters the multipole lenses 2 and 3 in parallel with the optical axis. The distance between the on-axis trajectory and the optical axis can be controlled using the transfer lenses 7 and 8 serving as rotationally symmetric lenses. In TEM observation, the transfer lenses 7 and 8 serving as rotationally symmetric lenses are used as the coma-free plane transfer condition and therefore are not suitable for controlling the spherical aberration. In STEM observation, on the other hand, the usage of the transfer lenses 7 and 8 serving as rotationally symmetric lenses can be selected freely to some extent. Accordingly, in TEM observation, it is preferred to excite the multipole lenses 2 and 3 in such a manner that the spherical aberration is corrected; and in changing the TEM observation to STEM observation, it is preferred to adjust the excitation of the transfer lenses 7 and 8 serving as rotationally symmetric lenses to adjust the spherical aberration while maintaining the excitation of the multipole lenses 2 and 3.

Figure 6:
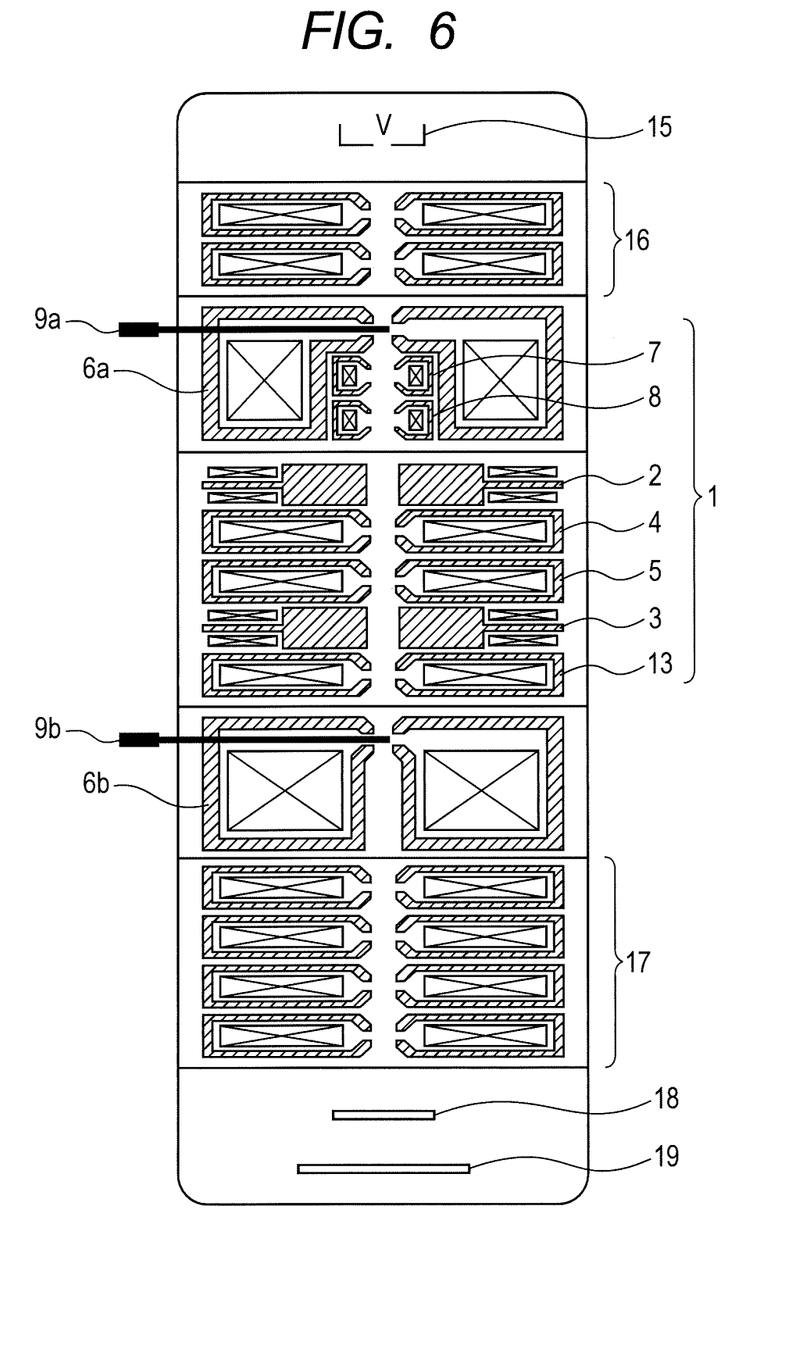
FIG. 6 is a configuration diagram of a transmission electron microscope (TEM/STEM) including the aberration correction device according to the first embodiment.

FIG. 6 shows a configuration in which the aberration correction device according to this embodiment is included in a transmission electron microscope (TEM/STEM). Unlike a usual TEM/STEM device, this transmission electron microscope has a configuration in which the two objective lenses serving as rotationally symmetric lenses, the objective lens 6a for TEM and the objective lens 6b for STEM, are included and the aberration correction device according to this embodiment is disposed therebetween.

In TEM observation, the current of an electron beam emitted by an electron source 15 is adjusted by an illumination-lens system 16 and then applied to a specimen disposed on the specimen stage 9a for TEM under an appropriate condition. The electron beam passes through the specimen; a transmission image thereof is enlarged by the objective lens 6a for TEM; and the aberration is corrected by the aberration correction device 1. The transmission image is then further enlarged by the transfer lens 13 serving as a rotationally symmetric lens, the objective lens for STEM, and a projection-lens system 17 and projected onto a fluorescent screen 19.

In STEM observation, the current of an electron beam emitted by the electron source 15 is adjusted by the illumination-lens system 16 and the objective lens 6a for TEM; and the electron beam is then made parallel with the optical axis by the transfer lenses 7 and 8 serving as rotationally symmetric lenses and enters the multipole lens 2. Subsequently, the aberration is corrected by the aberration correction device 1, and the beam is concentrated on the specimen disposed on the specimen stage 9b for STEM by the objective lens 6b for STEM. A certain region of the specimen is scanned by the electron beam, and the electron beam that has passed through the region is caused to enter the STEM detector 18 by the projection-lens system 17 under an appropriate condition to form an image. The specimen stage 9a for TEM, the specimen stage 9b for STEM, the fluorescent screen 19 for TEM, and the STEM detector 18 are movable and therefore can be withdrawn during non-use.

Figure 7:
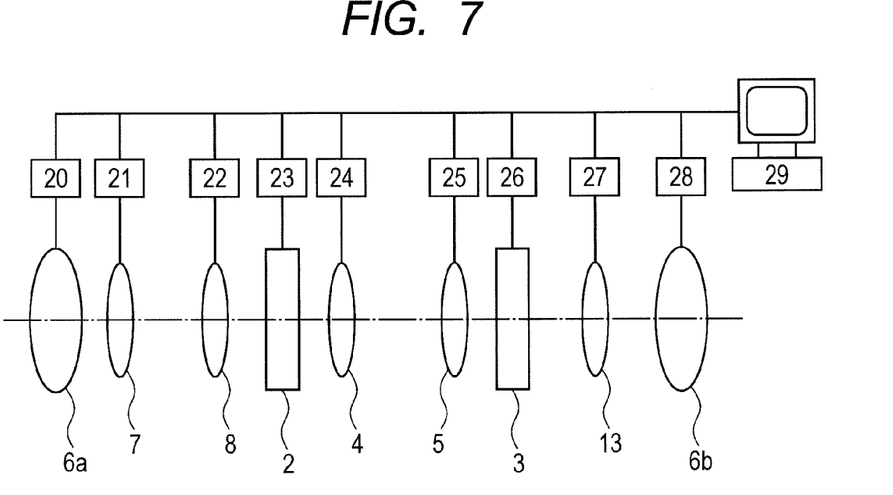
FIG. 7 is a diagram showing a configuration for controlling the lenses of the aberration correction device according to the first embodiment.

FIG. 7 shows a configuration in which the electron lenses (current sources 20 to 28 of the objective lenses serving as rotationally symmetric lenses, the transfer lenses serving as rotationally symmetric lenses, and the multipole lenses) included in the aberration correction device according to this embodiment are controlled by a computer 29 such as a personal computer.

In FIG. 7, the computer 29 corrects the aberration by calculating current values meeting the aberration correction conditions (known art) and transmitting proper signals to the current sources 20 to 28. Since the computer 29 includes a display unit, the operator can check the status of the device by watching the display unit.

In the configuration shown in FIG. 7, the operator can select mode and change lenses to be used by inputting an instruction, so as to switch between TEM observation and STEM observation. The same method for correcting the spherical aberration is used in both TEM observation and STEM observation. That is, the strength of the six-pole fields is adjusted by changing the excitation of the multipole lenses 2 and 3 using the current sources 23 and 26 and thus the amount of negative spherical aberration given by the six-pole fields is controlled.

To correct the on-axis coma aberration of the objective lens 6a for TEM in TEM observation, the on-axis coma aberration is controlled by changing the excitation of the transfer lenses 7 and 8 serving as rotationally symmetric lenses using the current sources 21 and 22 and transferring the coma-free plane of the objective lens 6a for TEM to the center of the multipole lens 2.

To correct the fifth-order spherical aberration in STEM observation, the fifth-order spherical aberration is controlled by changing the excitation of the transfer lens 13 serving as a rotationally symmetric lens using the current source 27. At this time, the third-order spherical aberration is also changed. For the third-order spherical aberration, as described above, by changing the excitation of the multipole lenses 2 and 3 using the current sources 23 and 26, the strength of the six-pole field is adjusted, controlling the amount of negative third-order spherical aberration given by the six-pole field. While this embodiment has been described using TEM/STEM, this embodiment is also applicable to devices which use charged particles other than electrons, such as ions.

As described above, according to this embodiment, it is possible to provide an aberration correction device capable of being used for both TEM and STEM and a charged particle beam device employing the same. Use of the aberration correction device capable of being used for both TEM and STEM allows a reduction in the number of power supplies as well as an increase in controllability. Further, since the objective lens for TEM and the objective lens for STEM are provided separately, the spherical aberration can be further improved.

The invention of the present application has been described above in detail. Main aspects of the invention are listed below.

(1) An aberration correction device includes: a first multipole lens disposed adjacent to an illumination lens; a second multipole lens disposed adjacent to a projection lens; a plurality of first transfer lenses disposed between the first and second multipole lenses and configured to transfer, to the second multipole lens, a coma-free condition of a first objective lens disposed adjacent to the illumination lens; a plurality of second transfer lenses disposed so as to be closer to the illumination lens than the first multipole lens and configured to transfer the coma-free condition of the first objective lens to the first multipole lens; and a third transfer lens disposed so as to be closer to the projection lens than the second multipole lens and configured to correct a fifth-order spherical aberration of a second objective lens disposed adjacent to the projection lens.

(2) A charged particle beam device includes: a charged particle source; an illumination lens configured to adjust an amount of a beam of charged particles emitted by the charged particle source; a projection lens configured to project the charged particles that have passed through a specimen, onto detection means (fluorescent screen, STEM detector); a first objective lens; an aberration correction device; and a second objective lens. The first objective lens, the aberration correction device, and the second objective lens are disposed in this order between the illumination lens and the projection lens. The aberration correction device includes: a first multipole lens disposed adjacent to an illumination lens; a second multipole lens disposed adjacent to a projection lens; a plurality of first transfer lenses disposed between the first and second multipole lenses and configured to transfer, to the second multipole lens, a coma-free condition of a first objective lens disposed adjacent to the illumination lens; a plurality of second transfer lenses disposed so as to be closer to the illumination lens than the first multipole lens and configured to transfer the coma-free condition of the first objective lens to the first multipole lens; and a third transfer lens disposed so as to be closer to the projection lens than the second multipole lens and configured to correct a fifth-order spherical aberration of a second objective lens disposed adjacent to the projection lens.

LIST OF REFERENCE SIGNS

1: aberration correction device; 1a: aberration correction device; 1b: aberration correction device; 2, 3: multipole lens; 4, 5: transfer lens; 6: objective lens; 6a: objective lens for TEM; 6b: objective lens for STEM; 7, 8: transfer lens; 9: specimen position; 9a: specimen stage for TEM; 9b: specimen stage for STEM; 10: on-axis trajectory in TEM observation; 11: coma-free plane of objective lens for TEM; 12: off-axis trajectory passing through coma-free plane in TEM observation; 13: newly added transfer lens; 14: on-axis trajectory in STEM observation; 15: electron source; 16: illumination-lens system; 17: projection-lens system; 18: stem detector; 19: fluorescent screen; 20 to 28: current source; 29: computer

The invention claimed is:

1. A charged particle beam device comprising:
a charged particle source;
an illumination lens configured to adjust an amount of a beam of charged particles emitted by the charged particle source;
a projection lens configured to project the charged particles that have passed through a specimen, onto detection means;
a first objective lens;
an aberration correction device; and
a second objective lens,
wherein the first objective lens, the aberration correction device, and the second objective lens are disposed in this order between the illumination lens and the projection lens, and
wherein the aberration correction device comprises:
a first multipole lens disposed adjacent to the illumination lens;
a second multipole lens disposed adjacent to the projection lens;
a plurality of first transfer lenses disposed between the first and second multipole lenses and configured to transfer, to the second multipole lens, a coma-free condition of the first objective lens disposed adjacent to the illumination lens;
a plurality of second transfer lenses disposed so as to be closer to the illumination lens than the first multipole lens and configured to transfer the coma-free condition of the first objective lens to the first multipole lens; and
a third transfer lens disposed so as to be closer to the projection lens than the second multipole lens and configured to correct a fifth-order spherical aberration of the second objective lens disposed adjacent to the projection lens; wherein
the first and second objective lenses are an objective lens for transmission electron microscope (TEM) and an objective lens for scanning transmission electron microscope (STEM), respectively, and
a specimen stage for TEM is disposed adjacent to the objective lens for TEM, and a specimen stage for STEM is disposed adjacent to the objective lens for STEM.

2. The charged particle beam device according to claim 1, wherein in TEM observation, a specimen to be observed is disposed on the specimen stage for TEM; the objective lens for TEM is used under strong excitation; the objective lens for STEM is not used or used under weak excitation; and an aberration of the objective lens for TEM is corrected.

3. The charged particle beam device according to claim 1, wherein in STEM observation, a specimen to be observed is disposed on the specimen stage for STEM; the objective lens for STEM is used under strong excitation; the objective lens for TEM is not used or used under weak excitation; and an aberration of the objective lens for STEM is corrected.

4. The charged particle beam device according to claim 1, wherein in STEM observation, a distance between the second multipole lens and the third transfer lens exceeds a distance between the third transfer lens and the second objective lens.

5. The charged particle beam device according to claim 1, wherein in both TEM observation and STEM observation, no change is made to excitation of the first transfer lenses, the second transfer lenses, and the third transfer lens.

6. The charged particle beam device according to claim 1, wherein in STEM observation following TEM observation, no change is made to excitation of the first and second multipole lenses; and adjustment is made to excitation of the second transfer lenses.

* * * * *